US011921145B1

(12) United States Patent
Siddharth et al.

(10) Patent No.: US 11,921,145 B1
(45) Date of Patent: Mar. 5, 2024

(54) ELECTRICAL EMULATOR SYSTEM

(71) Applicant: Regents of the University of Minnesota, Minneapolis, MN (US)

(72) Inventors: Raju Siddharth, Minneapolis, MN (US); Ned Mohan, St. Paul, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 0 days.

(21) Appl. No.: 17/499,047

(22) Filed: Oct. 12, 2021

Related U.S. Application Data

(60) Provisional application No. 63/090,484, filed on Oct. 12, 2020.

(51) Int. Cl.
G01R 31/08 (2020.01)
G01R 31/34 (2020.01)

(52) U.S. Cl.
CPC ......... *G01R 31/086* (2013.01); *G01R 31/085* (2013.01); *G01R 31/34* (2013.01)

(58) Field of Classification Search
CPC ..... G01R 31/086; G01R 31/085; G01R 31/34
See application file for complete search history.

(56) References Cited

U.S. PATENT DOCUMENTS

| | | | | |
|---|---|---|---|---|
| 4,464,120 A | * | 8/1984 | Jensen | G09B 23/186 434/366 |
| 7,478,022 B1 | * | 1/2009 | Stacy | H04Q 1/20 703/7 |
| 7,979,223 B2 | * | 7/2011 | Monti | G01R 31/2848 702/65 |
| 10,270,251 B1 | * | 4/2019 | Neely | H02J 3/28 |
| 10,948,936 B2 | | 3/2021 | Momoh | |

(Continued)

FOREIGN PATENT DOCUMENTS

| | | |
|---|---|---|
| CN | 101446998 A | 6/2009 |
| CN | 101794993 A | 8/2010 |

(Continued)

OTHER PUBLICATIONS

Adhikari et al. "WAMS Cyber-Physical Test Bed for Power System, Cybersecurity Study, and Data Mining," in IEEE Transactions on Smart Grid, Nov. 2017, vol. 8, No. 6, pp. 2744-2753.

(Continued)

*Primary Examiner* — Kyle R Quigley
(74) *Attorney, Agent, or Firm* — Steven M. Koehler; Westman, Champlin & Koehler, P.A.

(57) ABSTRACT

An electrical emulator system includes an emulator assembly comprising an emulator circuit board for emulating a component forming part of a modeled electrical system. The emulator circuit board includes an inverter mounted to the emulator circuit board, a set of input terminals electrically connected to the inverter, a set of output terminals electrically connected to the inverter and a processor electrically connected to the inverter and configured to control the inverter so as to provide emulation of a component of the modeled electrical system. A docking station includes a set of docking terminals for emulated line power. The docking station comprises guides to receive the emulator circuit board and align the set of input terminals and the set of output terminals to selected docking terminals of the set of docking terminals.

18 Claims, 9 Drawing Sheets

(56) References Cited

U.S. PATENT DOCUMENTS

| | | | | |
|---|---|---|---|---|
| 2011/0148114 A1* | 6/2011 | Garcia | ............... | H02J 3/386 290/44 |
| 2014/0156250 A1* | 6/2014 | Sterregaard | ............. | G06F 30/20 703/18 |
| 2014/0229153 A1* | 8/2014 | Grastein | ............ | H02J 3/381 703/18 |
| 2015/0095004 A1* | 4/2015 | Kim | ............ | F03D 7/048 703/7 |
| 2016/0147244 A1 | 5/2016 | Momoh | | |
| 2019/0237973 A1 | 8/2019 | Neely et al. | | |

FOREIGN PATENT DOCUMENTS

| | | |
|---|---|---|
| CN | 102708250 A | 10/2012 |
| CN | 102751737 A | 10/2012 |
| CN | 103545917 A | 1/2014 |
| CN | 103678785 A | 3/2014 |
| CN | 103715718 A | 4/2014 |
| CN | 107643457 A | 1/2018 |
| CN | 107918290 A | 4/2018 |
| CN | 108255069 A | 7/2018 |
| CN | 108831242 A | 11/2018 |
| CN | 108957378 A | 12/2018 |
| CN | 109088406 A | 12/2018 |
| CN | 109256020 A | 1/2019 |
| CN | 110262288 A | 9/2019 |
| KR | 20120093565 A | 8/2012 |
| KR | 20190029346 A | 3/2019 |
| KR | 20190030893 A | 3/2019 |

OTHER PUBLICATIONS

Bailey, T. "Modeling and Implementing a Digitally Embedded Maximum Power Point Tracking Algorithm and a Series-Loaded Resonant DC-DC Converter to Integrate a Photovoltaic Array with a Micro-Grid", Naval Postgraduate School Monterey California, Sep. 1, 2014, 75 pages.

Chen et al. "Real-time Integrated Model of a Micro-Grid with Distributed Clean Energy Generators and Their Power Electronics", 2016 IEEE Applied Power Electronics Conference and Exposition (APEC), 2016, pp. 2666-2672.

Crosbie et al. "High-Speed, Scalable, Real-Time Simulation Using DSP Arrays", PADS '04: Proceedings of the Eighteenth Workshop on Parallel and Distributed Simulation, May 2004, pp. 52-59.

Dayal et al. "Distributed VSCADA: An Integrated Heterogeneous Framework for Power System Utility Security Modeling and Simulation," 2015 Workshop on Modeling and Simulation of Cyber-Physical Energy Systems (MSCPES), 2015, pp. 1-6.

Gharavi, H. and Hu, B. "Scalable Synchrophasors Communication Network Design and Implementation for Real-Time Distributed Generation Grid," in IEEE Transactions on Smart Grid, Sep. 2015, vol. 6, No. 5, pp. 2539-2550.

Guo et al. "Real Time Simulation for the Study on Smart Grid", 2011 IEEE Energy Conversion Congress and Exposition, 2011, pp. 1013-1018.

Kamalasadan, S. and Al-Olimat, K. "Modeling and Control of a Micro-Grid Set Up Using Photovoltaic Arrays," 45th Southeastern Symposium on System Theory, 2013, pp. 80-87.

Kong et al. "Emulating the Features of Conventional Generator with Virtual Synchronous Generator Technology: An Overview", The Journal of Engineering, 2017, vol. 13, pp. 2135-2139.

Ma et al. "Circulating Current Control and Reduction in a Paralleled Converter Test-bed System," 2013 IEEE Energy Conversion Congress and Exposition, 2013, pp. 5426-5432.

Overlin, M. "A Modular Real-Time Hardware-in-the-Loop Simulation Environment for Microgrids", Department of Electrical Engineering and Computer Science at Massachusetts Institute of Technology, Sep. 2017, 153 pages.

Reddi, R. and Srivastava, A. "Real Time Test Bed Development for Power System Operation, Control and Cyber Security," North American Power Symposium 2010, 2010, pp. 1-6.

Spencer, M. "Power Simulator Upgrade for Smart Grid Algorithm Development and Testing", College of Engineering and Mineral Resources at West Virginia University, Aug. 2010, 62 pages.

Tan et al. "ScorePlus: An Integrated Scalable Cyber-Physical Experiment Environment for Smart Grid", 2015 12th Annual IEEE International Conference on Sensing, Communication, and Networking (SECON), 2015, pp. 381-389.

Vellaithurai et al. "Development and Application of a Real-Time Test Bed for Cyber-Physical System," in IEEE Systems Journal, Dec. 2017, vol. 11, No. 4, pp. 2192-2203.

Wu et al. "The Micro-Grid Fast Simulation Platform Exploitation Based on PSCAD," 2011 Twenty-Sixth Annual IEEE Applied Power Electronics Conference and Exposition (APEC), 2011, pp. 1737-1742.

* cited by examiner

ELECTRICAL EMULATOR SYSTEM

CROSS-REFERENCE TO RELATED APPLICATION(S)

This Application is a Non-Provisional application based on Provisional Application Ser. No. 63/090,484 filed Oct. 12, 2020, which is hereby incorporated by reference in its entirety.

GOVERNMENT FUNDING

This invention was made with government support under N00014-15-1-2391 and N00014-19-1-2018 awarded by the Office of Naval Research. The government has certain rights in the invention.

BACKGROUND

Electrical power grids are constantly being changed as loads, transmission lines, generation stations, substations and the like are added, removed or changed. As such, techniques have been advanced to model the electrical power grid or portions thereof. Modeling can include software modeling where the foregoing components are virtually modeled and digitally connected together. Testbed modeling involves electrically connecting physical models of the components at low-level voltages and operating the testbed under various conditions. Testbed modeling can be preferred in an academic environment because it provides a "hands on" approach for the student. However, modeling of the power grid with the testbed is typically time consuming and requires a number of different individual components in order to, for example, model the various generators and loads of the portion of the power grid being modeled. A third solution uses components that emulate actual power grid components but in this system a single, centralized powerful computer used control emulation across all components of the test bed modeled power grid. An improved physical modeling system would be desirable.

SUMMARY

This Summary and the Abstract herein are provided to introduce a selection of concepts in a simplified form that are further described below in the Detailed Description. This Summary and the Abstract are not intended to identify key features or essential features of the claimed subject matter, nor are they intended to be used as an aid in determining the scope of the claimed subject matter. The claimed subject matter is not limited to implementations that solve any or all disadvantages noted in the Background.

An electrical emulator system includes an emulator assembly comprising an emulator circuit board for emulating a component forming part of a modeled electrical system. The emulator circuit board includes an inverter mounted to the emulator circuit board, a set of input terminals electrically connected to the inverter, a set of output terminals electrically connected to the inverter and a processor electrically connected to the inverter and configured to control the inverter so as to provide emulation of a component of the modeled electrical system. A docking station includes a set of docking terminals for emulated line power. The docking station comprises guides to receive the emulator circuit board and align the set of input terminals and the set of output terminals to selected docking terminals of the set of docking terminals.

DETAILED DESCRIPTION OF THE ILLUSTRATIVE EMBODIMENTS

Figure 1:
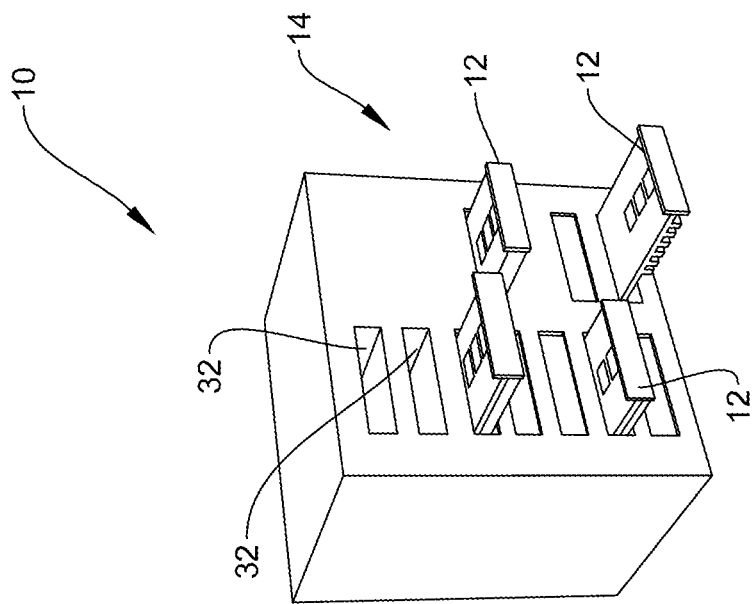
FIG. 1 is a perspective view of an emulator assembly and a docking station.
Figure 1:
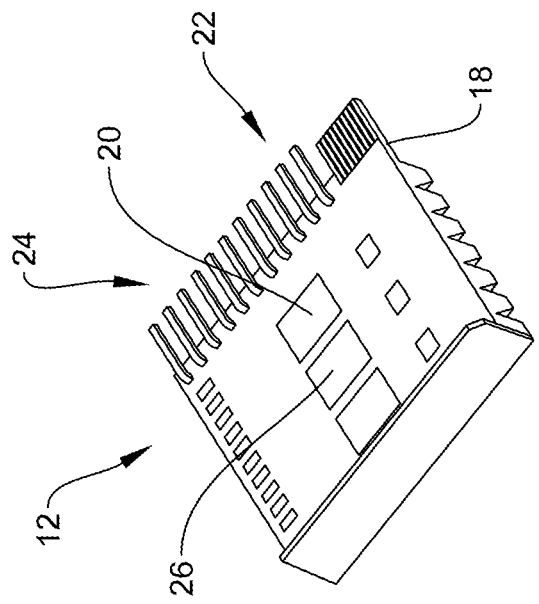
Figure 2:
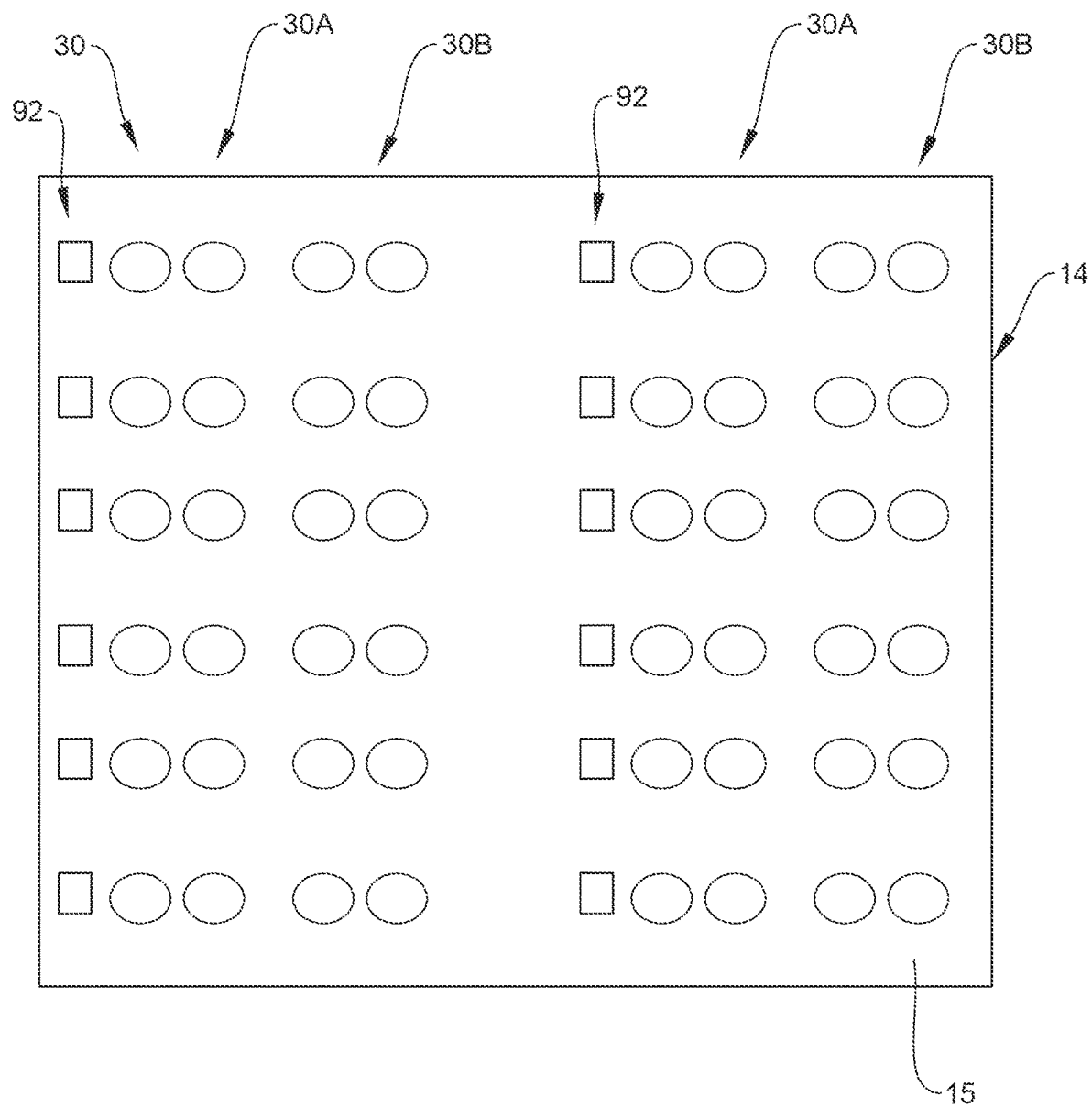
FIG. 2 is a schematic illustration of a back panel of the docking station.

Components of an electric emulator system 10 are illustrated pictorially in FIGS. 1 and 2. The emulator system 10 includes an emulator assembly 12 and a docking station 14 for receiving one, or typically, two or more emulator assemblies 12. The emulator assembly 12 includes an emulator circuit board 18 used for emulating a component forming part of a modeled electrical system. The emulator circuit board 18 includes an inverter 20 mounted to the emulator circuit board 18. A set of input terminals 22 and a set of output terminals 24 are electrically connected to the inverter 20. A processor 26 also mounted to the emulator circuit board 18 is electrically connected to the inverter 20 and is configured to control the inverter 20 so as to provide emulation of a component of an electrical system.

The docking station 14 receives one, or typically, two or more emulator assemblies 12 and commonly includes a set of docking terminals 30, illustrated in FIG. 2 as being on the back panel 15 of the docking station 14. The docking station 14 includes guides 32, which receive portions of the emulator circuit board 18 such as edge portions thereof so as to support the emulator assembly 12 in the docking station 14 and align the input terminals 22 and output terminals 24 with corresponding docking terminals 30 on the back panel. For instance, by way of example, input terminals 22 of each of the emulator assemblies 12 would electrically connect individually to docking terminals 30A in FIG. 4, while output terminals 24 of the emulator assemblies 12 would electrically connect individually to docking terminals 30B.

Figure 3:
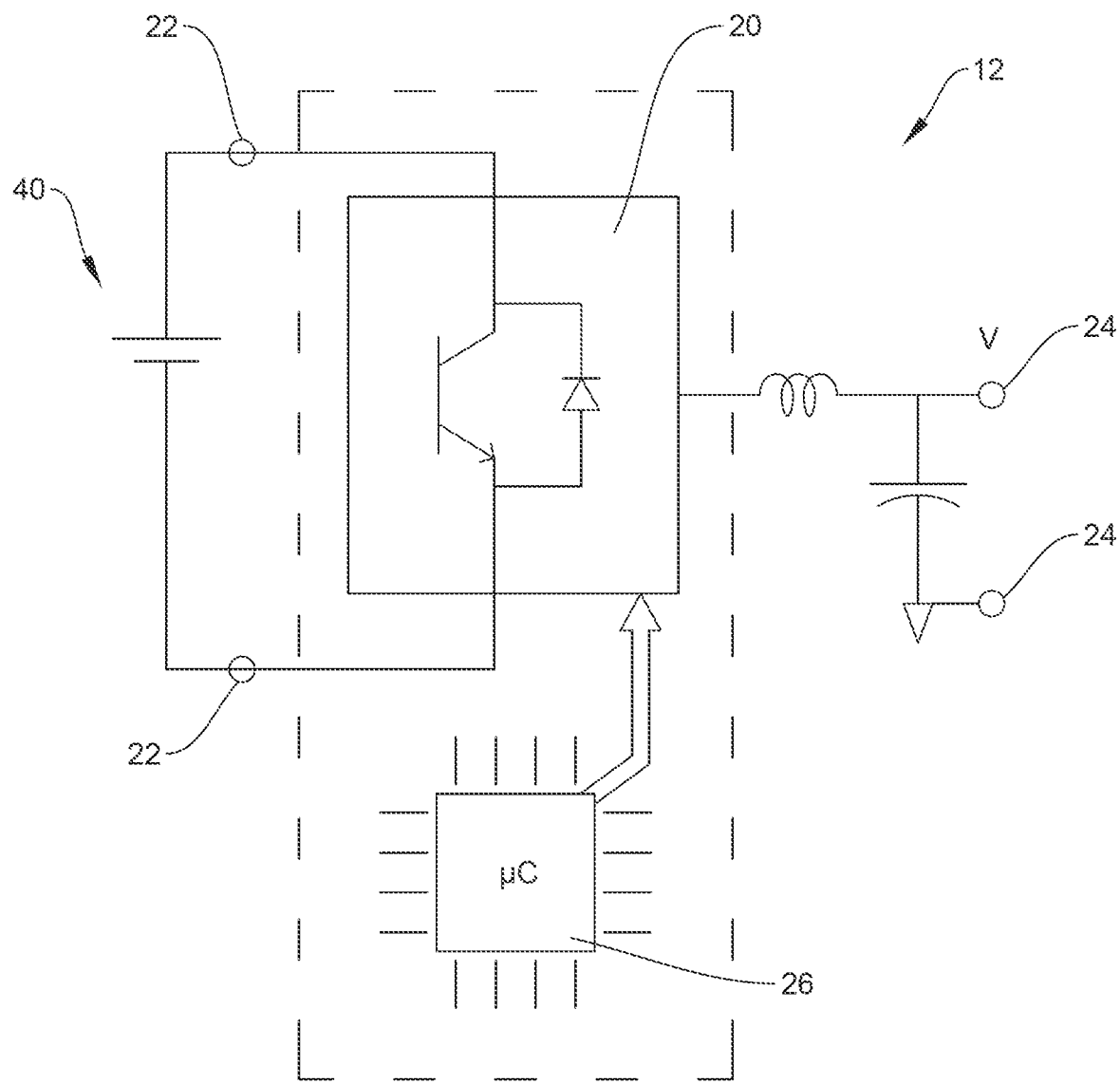
FIG. 3 is a schematic circuit of the emulator assembly.

FIG. 3 schematically illustrates components of the emulator assembly 12. As described above, each emulator assembly 12 includes the input terminals 22 and output terminals 24. The input terminals 22 are electrically connected to the inverter 20 to receive power from a power source indicated at 40. Herein the power source is indicated as a DC power source; however, an AC power source could be used if the emulator assembly 12 includes a rectifying circuit or other circuit to convert the AC voltage to a DC voltage, which would them be used by the inverter 20 to provide a desired output at output terminals 24. In the alternative, the docking station 14 can include a rectifying circuit to receive AC voltage from the power source and provide DC voltage to each of the emulator assemblies 14 such as through a common bus (not shown). The processor 26 (typically a microprocessor) is programmed or otherwise controlled so as to provide control signals to the inverter 20 to emulate a desired component or condition in the model electrical system. Typically, the emulator circuit board 18 includes bonded electrical connectors such that the inverter 20 and processor 26 as well as other support components can be mounted to the emulator circuit board 18 and electrically connected to each other via the bonded electrical connectors.

Figure 4:
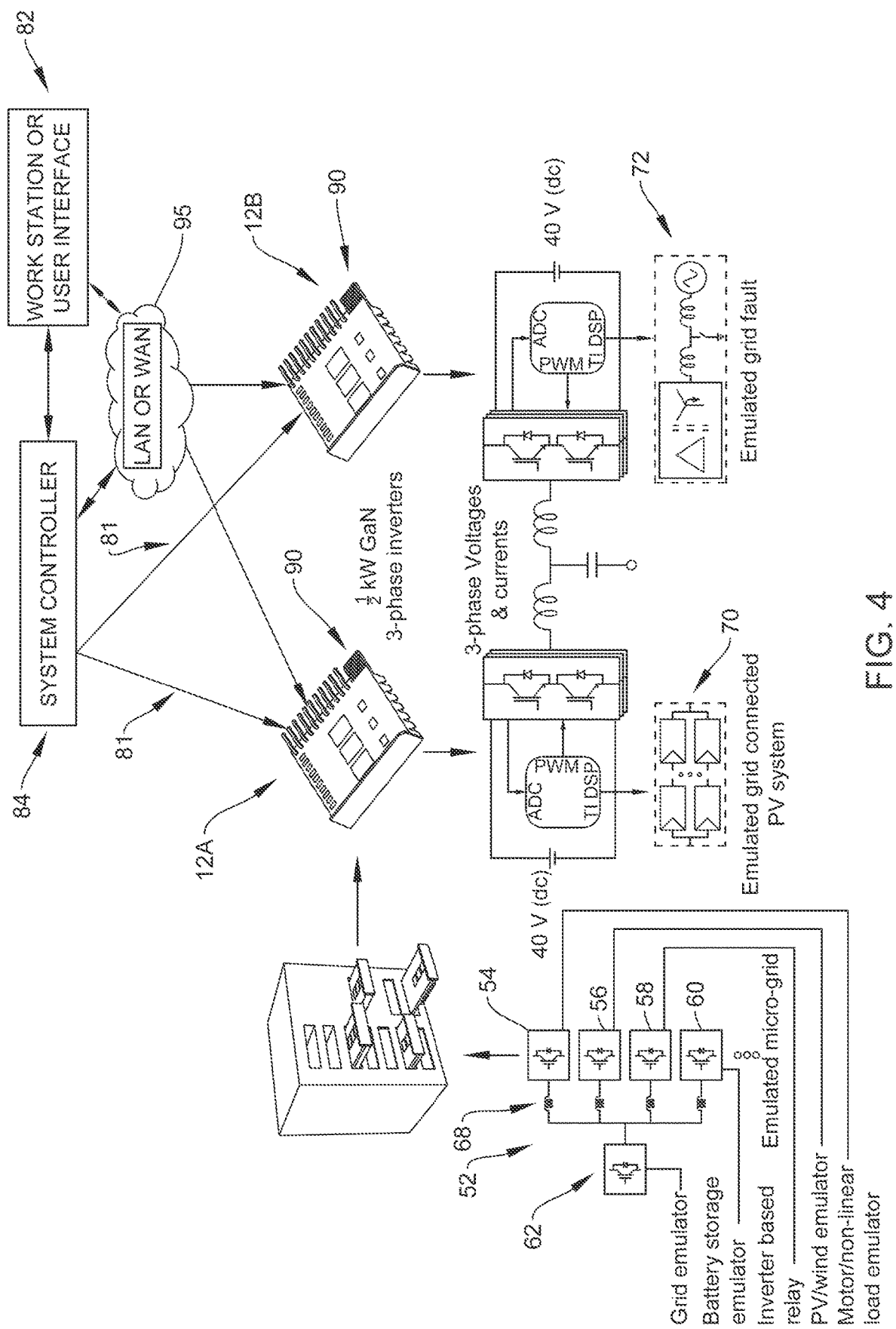
FIG. 4 is schematic illustration of a modeled system.

The emulator system 10 can be used to emulate various electrical systems and be used to also test electrical components or systems. An exemplary application is illustrated in FIG. 4. A pictorial representation of a micro-power grid is indicated at 52. The micro-grid 52 includes components commonly found on a power grid such as motors or other non-linear loads 54, various forms of generators such as photovoltaic, winds, gas, nuclear, or coal 56, inverter based relays 58, and a battery storage system 60, to name just a few. The micro-grid 52 is but just a small portion of a larger power grid where the remainder of the power grid is represented by another emulator 62. An emulator assembly 12 described above would be provided in the docking station 14 so as to emulate each of the forgoing components 52, 56, 58, 60 and 62. The emulated system operates at a low voltage such as 40 volts AC or DC, where the emulator assemblies 12 include one or more inverters 20 to produce either a single-phase voltage output, or a multiphase voltage output such as a three-phase output.

As discussed above, each of the emulator assemblies 12 is mounted in the docking station 14; hence the complete micro-grid 52 is a organized in compact assembly well suited for a lab bench or table as opposed to a typical test bed, which would take up a much larger surface area in order to interconnect the various components. As described above, the docking station 14 includes docking terminals 30, which would be interconnected so as to form the connections of the emulated micro-grid 50. For example, the docking terminals 30 can be implemented using well-known connectors used to securely electrical connect the emulator assemblies 12, but also allow them to be reconfigurable as desired.

Depending on the system being modeled, additional components such as inductors 68 shown in the emulated micro-grid 50 can be external to the docking station 14 if desired; however, if such inductors are used commonly in the emulated system, the inductors 68 can be mounted permanently to and electrically connected as part of the emulator assembly 12. In another embodiment, another circuit board can be used to support the inductor 68 (or any other component or components). Such a circuit board can be received by the docking station 14 and can have input and output terminals that connect to associated terminals 30 on the back panel 15 like the emulator assemblies 12 such that each inductor 68 (or other component or components) can be connected as desired in the modeled system but be retained in the docking station 14 rather than being external thereto.

FIG. 4 further illustrates schematic circuit representations for each of the emulator assemblies 12A and 12B as used in the modeled system. By way of example, emulator assembly 12A is configured to emulate a photovoltaic generator indicted at 70, while emulator assembly 12B is configured to emulate a grid fault condition 72 that can occur in the emulated micro-grid 50 at a modeled transformer of the power grid. The emulated modeled transformer is not shown in system 52. It should be noted that the emulated component or condition is not limited. For instance, the emulated component or condition can be in the form of a mathematical equation and/or based on operating states. Without limitation, some of the loads, components or conditions that can be emulated include motors such as a DC motor (multiple variants thereof as is known), induction motor (squirrel cage as well as DFIG (doubly fed induction generator)), synchronous motors (multiple variants thereof as is known). If desired, the emulator assembly 12 can emulate lighting loads (incandescent, led, fluorescent tube etc.), nonlinear loads such as industrial arc welding, and sources such as but not limited to traditional synchronous generators, wind turbines and generators, photovoltaic panels, diesel/gas generators and battery storage. Emulation can include normal and/or abnormal operation of any of the foregoing.

Each processor 26 on the emulator assemblies 12A and 12B is configured so as to control the associated inverters 20 so as to emulate any of the above-described components. Preferably, the emulator assemblies 12A and 12B are identical to each other or to a set of such assemblies so as to have the same processor 26 and/or inverters 20. In this manner, the number of parts needed to model a system is greatly reduced since all or at least many emulator assemblies are identical and can be individually programmed as needed to perform the desired emulation.

A system controller 80 can perform one or both functions typically required to set up and run the emulated system. The system controller 80, using for example a workstation or user interface 82, can be used to program each of the processors 26 provided on the emulator assemblies 12, as indicated by arrows 81. After programming, the system controller 80 can be used to then control the micro-processors during emulation of the emulated system 50 by providing suitable control signals to each processor 26 so as to command the processor 26 to execute the desired emulation. It should be understood that the controller 80 does not control the inverters 20 directly, but rather the associated processor 26 controls the inverter(s) 20. However, the processors 26 can be programmed to control the inverter(s) 20 so as to emulate different operating conditions of the emulated component. For instance, the processor 26 can be programmed with a first routine that controls the inverter(s) 20 to emulate the component operating normally, while a second routine of the processor 26 can be control the inverter(s) 20 to emulate the component operating abnormally such as in a fault condition. The system controller 80 can provide control signals to each of the processors 26 to instruct when and which routine to execute. For example, emulator 12B can have a first routine to emulate the transformer providing normal 3-phase power, and a second routine to emulate a fault condition occurring on the emulated transformer. Such control signals are also indicated by arrows 81 from the system controller 80 to each of the system emulator assemblies 12A or 12B.

It should be noted that in one embodiment, the system controller 80 is electrically connected to each of the emulator assemblies via a hardwired connection where control input terminals indicated generally at 90 at each of the emulator systems 12A and 12B are electrically connected to suitable output terminals (not shown) provided on the system controller 80 typically through a communications bus or the like. The control terminals 90 would electrically connect with a data port 92 illustrated in FIG. 3 when the emulator assembly is inserted or mounted to the docking station 14. The system controller 80 functions as a supervisory processing unit and includes a processor such as a microprocessor, operably connected to a transceiver and memory all of which can be mounted to a circuit board similar to the emulator assemblies 12 and mounted in the docking station 14 in a manner similar to the emulator assemblies 12 in one embodiment, or otherwise secured to the docking station 14 in manner separate from the emulator assemblies 12. The system controller 80 can communicate to a workstation 82 being connected directly thereto wired or wirelessly, or via a local area network and/or wide area network 95. The connection between the system controller 80 on the docking station 14 and the workstation 82 such as a computer (or a mobile device) can be through USB/Ethernet or wirelessly. In this configuration, the system controller 80 does not perform any emulation. Rather, the system controller 80 takes care of networking and relaying data between the processor on each emulator assembly 12, as well as to the workstation 82 being a computer (or a mobile device) connected to it.

However, it should be understood that the system is not limited to such configurations in that in other embodiments, the emulator assemblies 12 and system controller 80 can include communication transmitters, receivers, and/or transceivers so as the have a wireless connection (for example, using Bluetooth, etc.) such that a wired hard connection between the system controller 80 and the emulator assemblies 12A and 12B is not needed. In addition, the system controller 80 can be remote from the docking station(s) 14 having the emulator assemblies 12 where for example the system controller 80 is connected to a local area network and/or wide area network 95, such as the internet, the emulator assemblies 12A and 12B further being connected to network 95. The system controller 80 can be used simply to control the operations of the emulator assemblies 12 during system modeling. In this situation, programming of the associated processors is provided directly from the workstation or user interface 82 to each of the emulator assemblies 12 directly or via the local area network or wide area network 95. Likewise, the workstation or user interface 82 can be integrated as part of the system controller 80, or operably connected thereto, such that the system controller 80 can then provide requisite programming of the processes 26.

Figure 5:
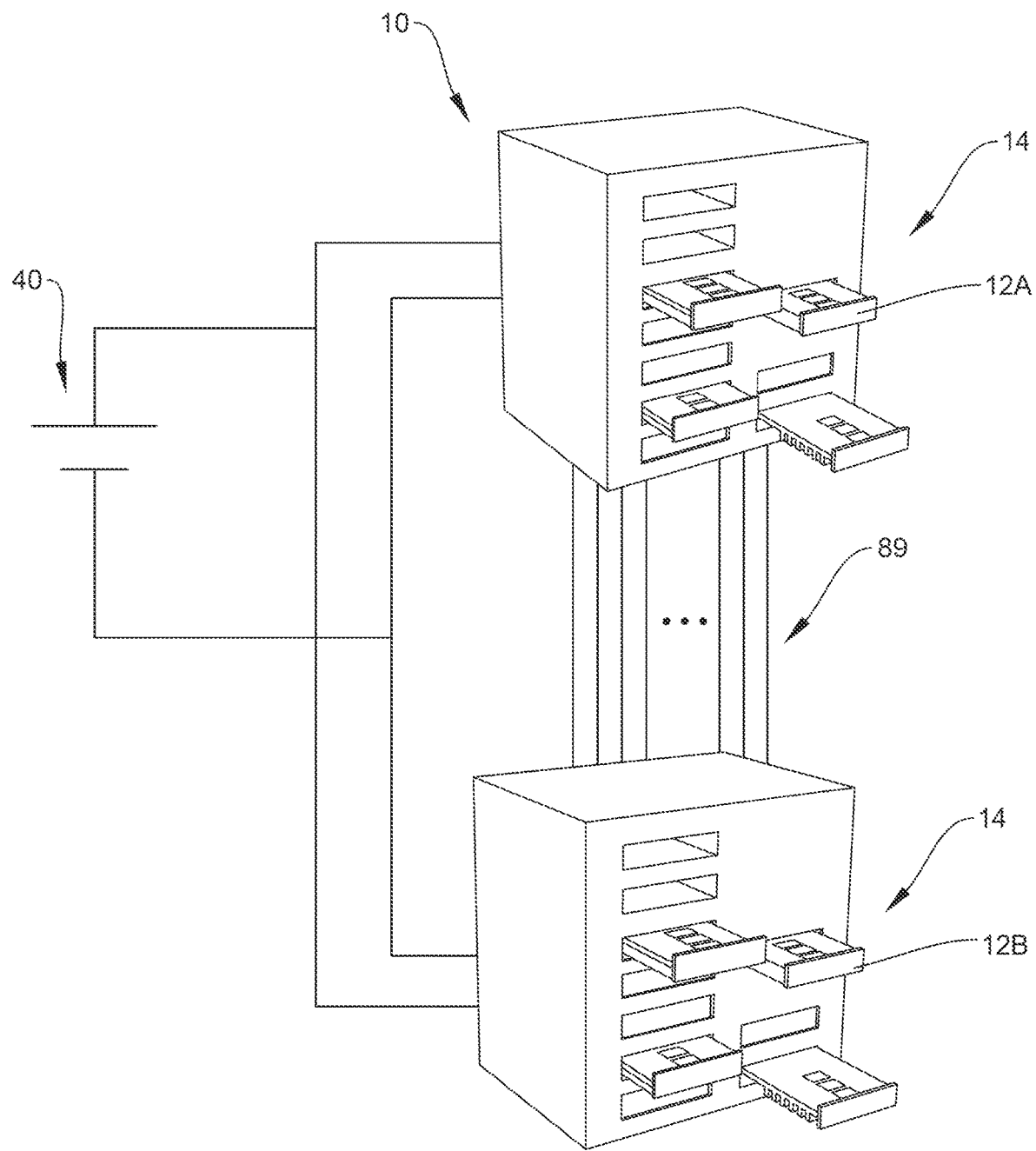
FIG. 5 is a schematic illustration of two docking stations being interconnected.

It should be noted that the emulator system 10 herein disclosed is not limited to a single docking station 14 but rather, multiple docking stations 14, for example, two or more can be interconnected so as to model a much larger system as illustrated in FIG. 5. Typically, a single power source 40 is connected to each of the docking stations 14; however, multiple power sources can also be used. The system controller 80, work station or user interface 82 as illustrated in FIG. 4 can be used to control the emulator assemblies in the embodiment of FIG. 5 either via direct connections 81 or via LAN or WAN 95 as illustrated in FIG. 4. This is illustrated in FIG. 5 by having emulator assembly 12A in one of the docking stations 14, while emulator assembly 12B is in the other docking station 14. However, the particular advantage of using multiple docking stations 14, each docking station 14 having multiple emulator assemblies, enables complex systems to be modeled such as power grid 93 illustrated in FIG. 6, where the various motors, generators and transformers are each emulated and interconnections made via the connectors provided on the back panels (FIG. 2) of the docking stations 14 to different emulator assemblies of each docking station 14 as well as interconnections between the emulator assemblies of the two or more docking stations 14 (two in the exemplary embodiment of FIG. 5) as represented by interconnections 89.

Figure 7:
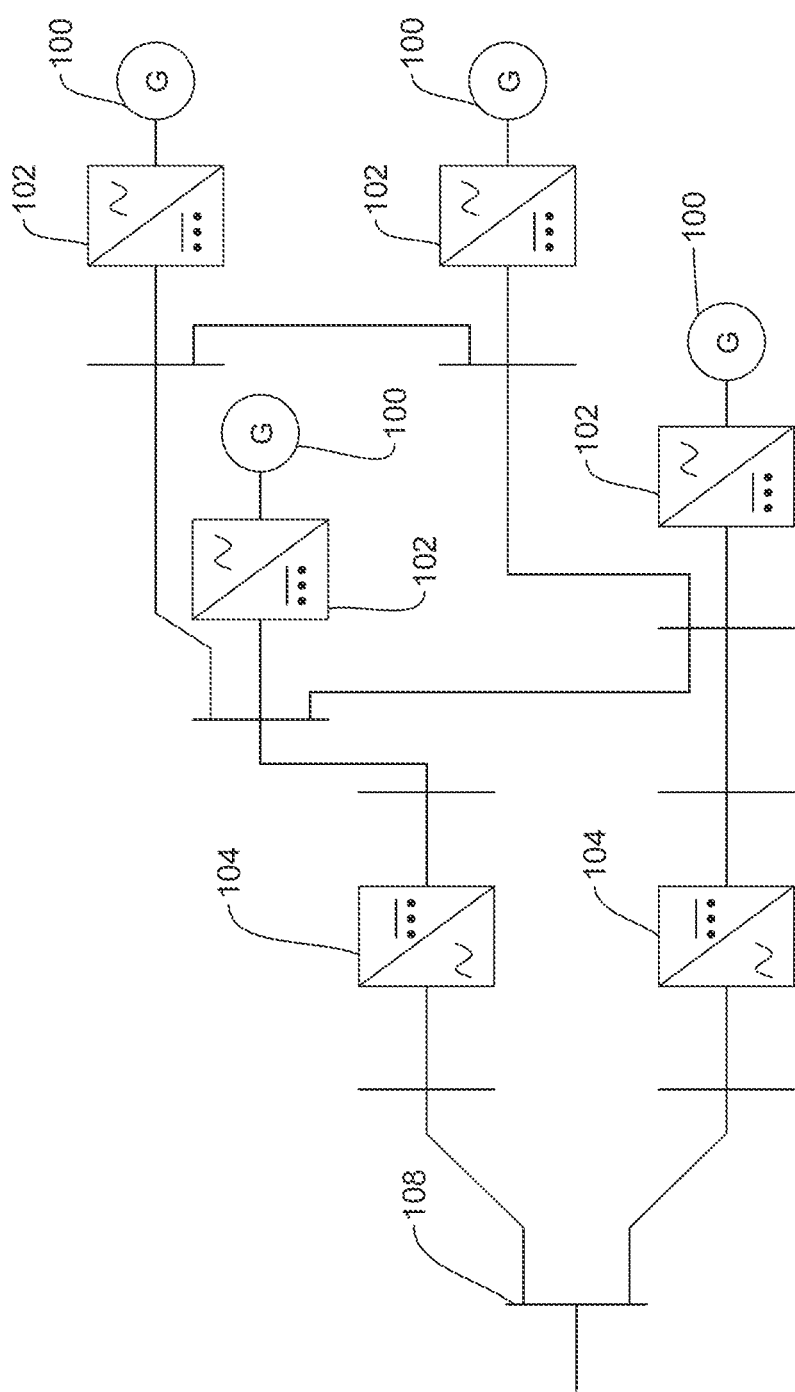

FIG. 7 illustrates a one-line diagram of a windfarm having a DC grid, all of which can be emulated with the docking station(s) 14 and emulator assemblies 12. The windmill generators are indicated at 100 and provide AC power to HVDC converters 102, which power a DC transmission system. AC power is obtained from HVDC converters 104 so as to provide AC power to an electrical grid indicated at 108.

Figure 6:
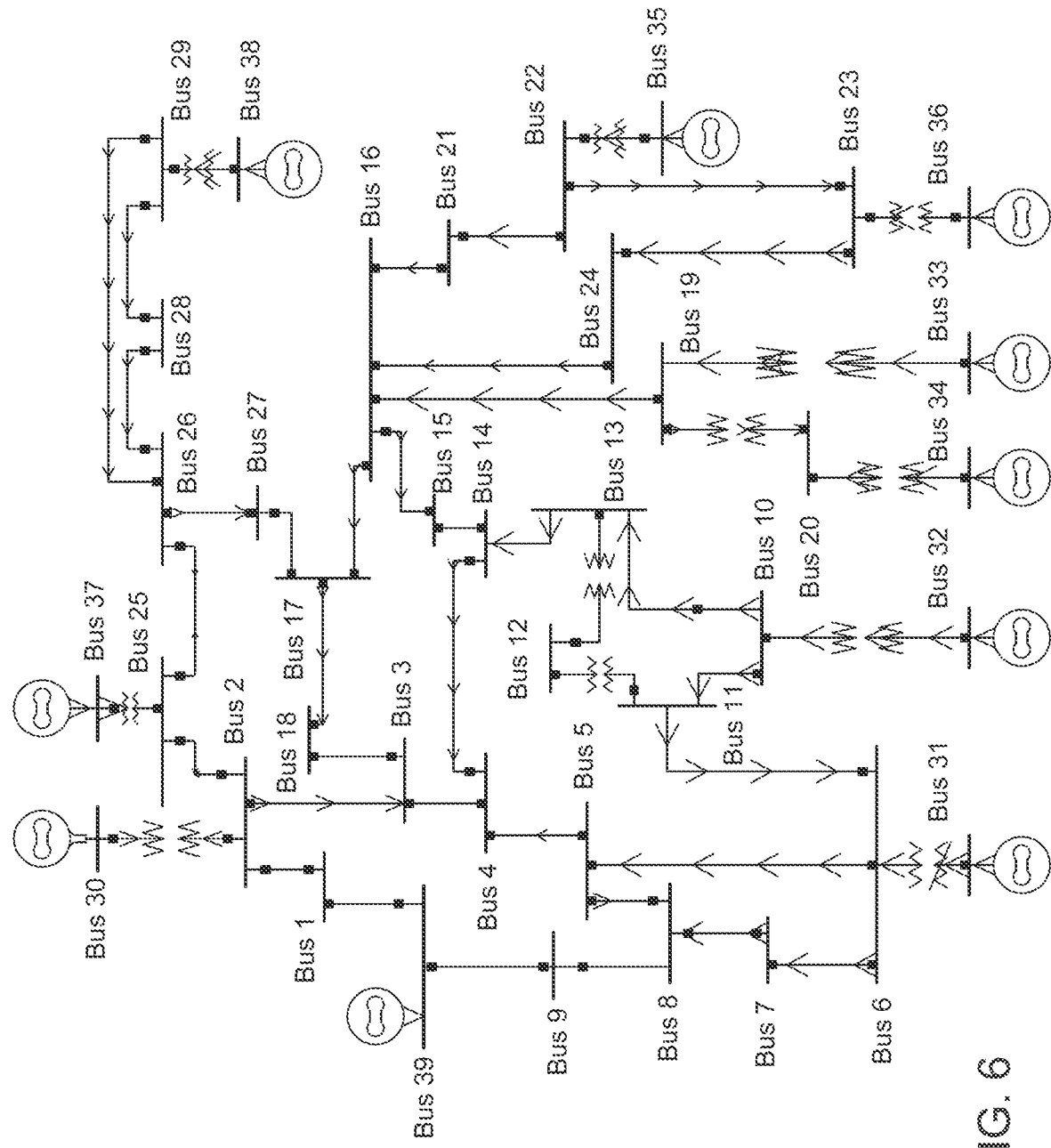
FIGS. 6 and 7 are schematic illustrations of power grids that can be modeled by an emulator system.
Figure 8:
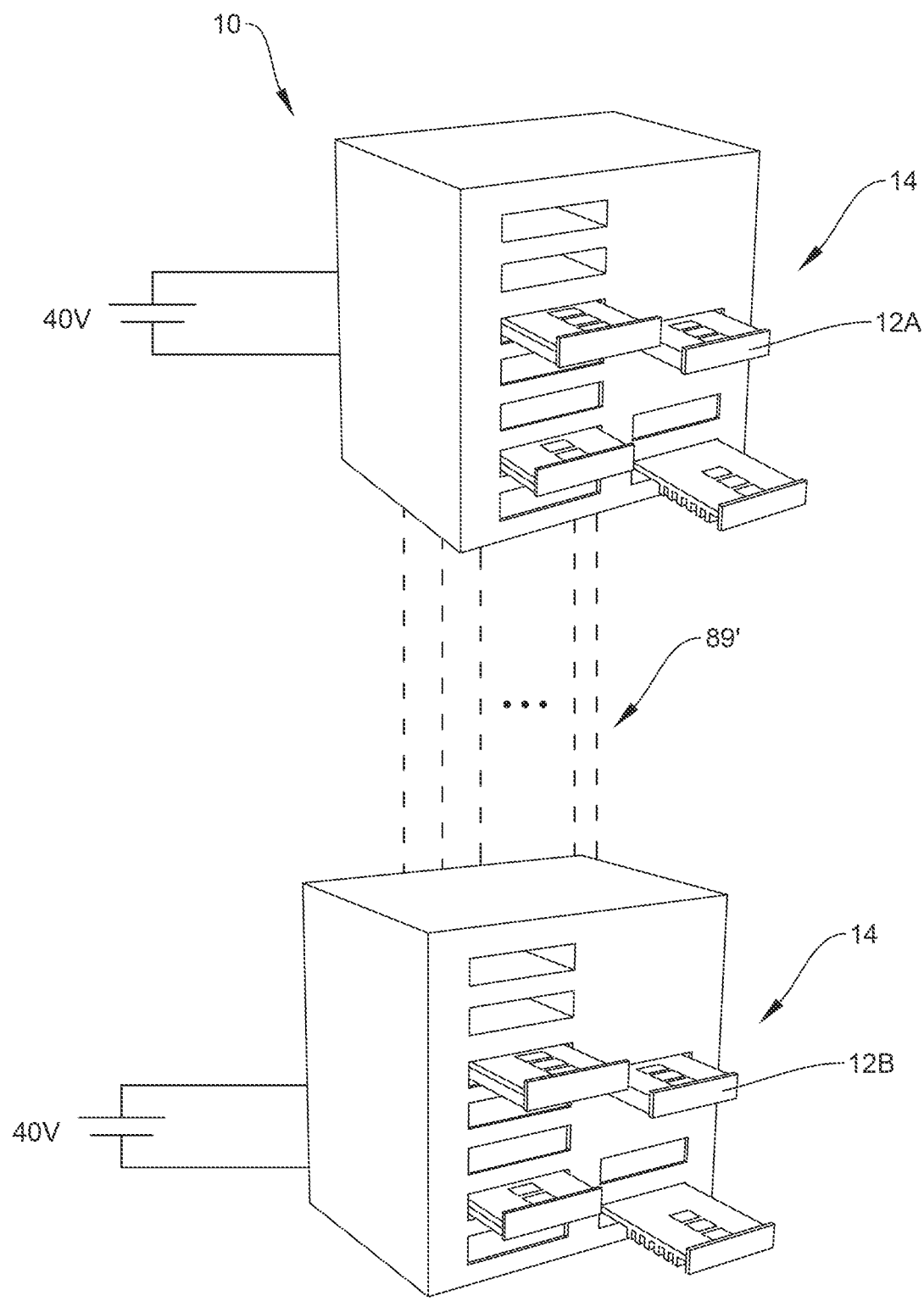
FIG. 8 schematically illustrates two docking stations with emulator assemblies virtually connected.

Although illustrated in FIG. 5 where the emulator assemblies of two (or more) docking stations 14 are interconnected via connections 89 to model a desired system such as but not limited to the circuits of FIG. 4, 6 or 7, it should be noted that connections 89 may not be present in all emulated systems. FIG. 8 illustrates two docking stations 14 that are not interconnected with connections 89 but rather are virtually connected represented by dashed lines 89'. For example, assume emulator assembly 12A of the upper docking station is to be virtually connected with emulator assembly 12B of the lower docking station. Each virtual connection is made by controlling the emulator assemblies 12A and 12B to have the same output voltage. Hence, although there is no physical connection between emulator assemblies 12A and 12B, a desired system, and various operating states of the system, can be simulated by controlling the inverters of each respective emulator assembly so as to simulate the interconnections virtually by controlling each inverter to have the same voltage as that of the virtually connected emulator assembly. This is particularly advantageous when the emulator assemblies are in different docking stations 14 as illustrated in FIG. 8, although technically it is also possible to have virtual connections among emulator assemblies in the same docking station. As in the embodiment of FIG. 5, the system controller 80, work station or user interface 82 as illustrated in FIG. 4 can be used to control the emulator assemblies in the embodiment of FIG. 8. The control signals from the supervisor controller 80 can be directly connected to each of emulator assemblies of each docking station 14 of FIG. 8; however, in many applications connections from the system controller 81 to each of the emulator assemblies is via wired or wireless network such as the internet. There are no distance constraints between the system controller 80 and each of the docking stations 14 having the emulator assemblies as long as the time it takes to provide control signals from the system controller 80 to the emulator assemblies is sufficiently fast to perform the desired simulation.

It should be noted as indicated above, it may be sufficient to form the virtual connections by controlling the output voltage of each of the virtually connected emulator assemblies to be the same. However, in a further embodiment, each of the virtually connected emulator assemblies could in fact be physically connected to an inductor in the docking station or another emulator assembly simulating the inductor. Such use of inductors or simulated inductors connected to the emulator assemblies that are virtually connected, could provide some improved simulation of the virtual connection of the virtually connected emulator assemblies.

Figure 9:
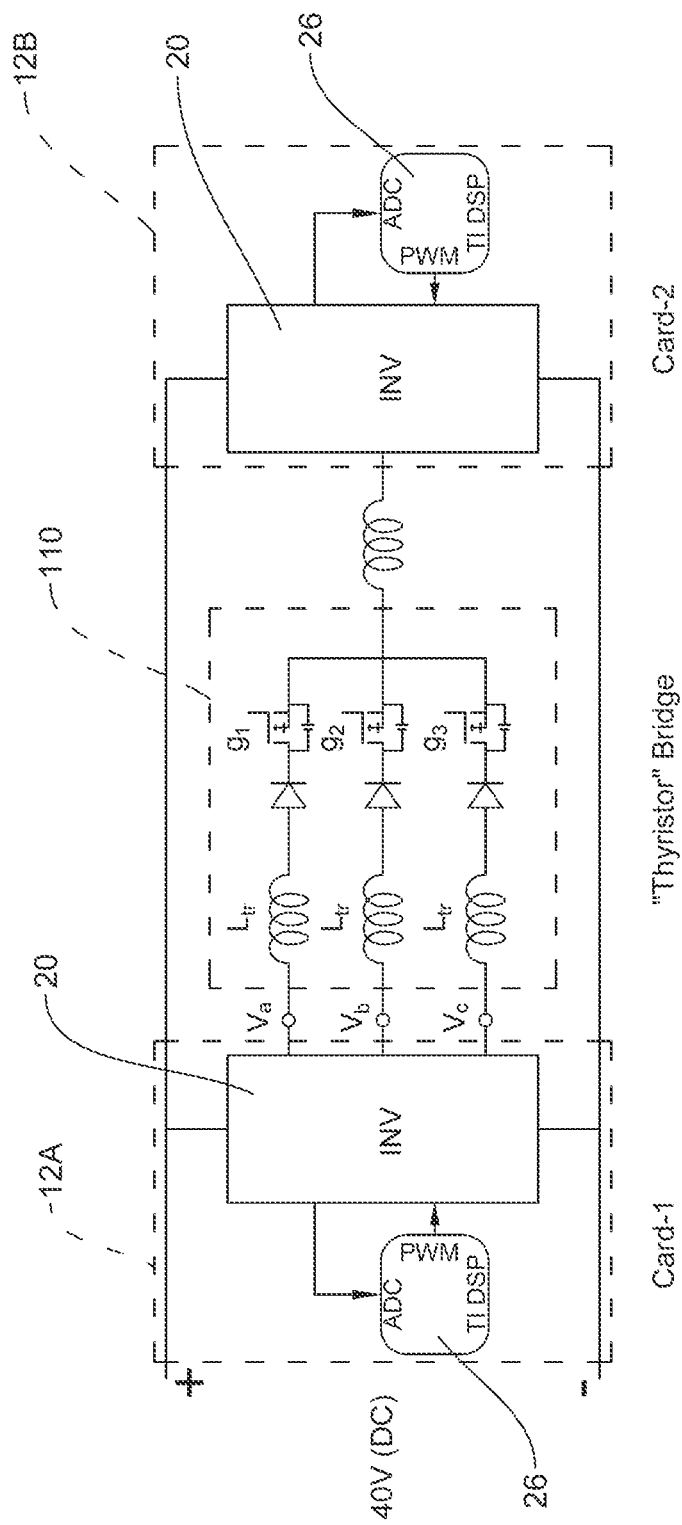
FIG. 9 is a schematic illustration of two emulator assemblies for testing an electrical component or circuit.

The emulator system 10 described herein is also not limited to modeling of power grids or portions thereof but can also be used to test various forms of electrical hardware, where the hardware is used in a larger electrical circuit or component. FIG. 9 is an exemplary embodiment of such use. In this embodiment, emulator assemblies 12A and 12B are connected to a component under test, herein a thyristor bridge 110 by way of example. Each of the emulator assemblies 12A and 12B are operated so as to subject the component under test to different operating conditions where the remainder of the circuit in which the component under test is operates in is modeled by the emulator assemblies 12A and 12B.

Although the present invention has been described with reference to preferred embodiments, workers skilled in the art will recognize that changes may be made in form and detail without departing from the spirit and scope of the invention.

What is claimed is:

1. An electrical emulator system comprising:
an emulator assembly comprising:
a first plurality of first emulator circuit boards, each first emulator circuit board comprising:
a first controllable AC voltage source mounted to the first emulator circuit board, the first controllable AC voltage source having first input terminals and first AC output terminals;
a set of first input terminals electrically connected to first input terminals of the first controllable AC voltage source;
a set of first output terminals electrically connected to the first AC output terminals of the first controllable AC voltage source; and
a first processor electrically connected to the first controllable AC voltage source and configured to control the first controllable AC voltage source so as to provide AC voltage at the first AC output terminals for emulation of a first set of components of a modeled electrical power grid;
a first docking station having a set of first docking terminals for emulated line power, the first docking station comprising guides to removably receive each first emulator circuit board separately therein and align and electrically connect the set of first input terminals and the set of first output terminals to selected first docking terminals of the set of first docking terminals;
a second plurality of second emulator circuit boards, each second emulator circuit board of the second plurality comprising:
a second controllable AC voltage source mounted to the source emulator circuit board, the second controllable AC voltage source having second input terminals and second AC output terminals;
a set of second input terminals electrically connected to second input terminals of the second controllable AC voltage source;
a set of second output terminals electrically connected to the second AC output terminals of the second controllable AC voltage source;
a second processor electrically connected to the second controllable AC voltage source and configured to control the second controllable AC voltage source so as to provide AC voltage at the second AC output terminals for emulation of a second set of components of the modeled electrical power grid;
a second docking station having a set of second docking terminals for emulated line power, the second docking station comprising guides to removably receive each second emulator circuit board of the second plurality separately therein and align and electrically connect the set of second input terminals and the set of second output terminals to selected second docking terminals of the set of second docking terminals;
a first set of connectors electrically interconnecting selected first docking terminals of the first docking station so as to simulate a first bus of the modeled electrical power grid;
a second set of connectors electrically interconnecting selected second docking terminals of the second docking station so as to simulate a second bus of the modeled electrical power grid; and a third set of connectors to electrically interconnect the first and second docking stations to simulate electrical connection of the first and second buses of the modeled electrical power grid.

2. The electrical emulator system of claim 1 and further comprising:
a third plurality of third emulator circuit boards, each third emulator circuit board comprising:
a third set of input terminals electrically connected to the third controllable AC voltage source; and
a third set of output terminals electrically connected to AC output terminals of the third controllable AC voltage source; and
a third processor electrically connected to the third controllable AC voltage source and configured to control the third controllable AC voltage source so as to provide AC voltage for emulation of the third component of the modeled electrical system;
wherein the first docking station includes a third set of docking terminals for emulated line power, the first docking station comprising guides to removably receive the third emulator circuit boards and align and electrically connect the third set of input terminals and the third set of output terminals to a third set of selected docking terminals of the first set of docking terminals; and
a third set of connectors electrically interconnecting selected docking terminals of the first docking station so as to simulate a third bus of the modeled electrical power grid.

3. The electrical emulator system of claim 1 wherein each of the first emulator circuit boards and each of the first emulator circuit boards includes conductors bonded to each of the respective emulator circuit boards and wherein each respective processor is mounted to the associated emulator circuit board.

4. The electrical emulator system of claim 1 and a controller electrically connected to each of the first and second processors.

5. The electrical emulator system of claim 4 and a user interface connected to the controller.

6. The electrical emulator system of claim 1 wherein each docking station includes at least a receiver operably connected to the associated processor of each docking station and wherein the electrical emulator system includes a controller configured to communicate wirelessly to each of the first and second processors.

7. The electrical emulator system of claim 1 and further comprising a controller, wherein each docking station includes terminals for forming a wired electrical connection to the controller.

8. The electrical emulator system of claim 4 wherein at least one of the first and second processors and/or the controller includes a network connection allowing access from a remote location over the Internet.

9. The electrical emulator system of claim 1 wherein each of the first and second docking stations have identical processors and/or controllable AC voltage sources.

10. The electrical emulator system of claim 1 wherein the emulator system is configured to model an electrical system having one or more generators and one or more electrical system loads.

11. The electrical emulator system of claim 10 wherein the one or more electrical system loads are at least one motor.

12. The electrical emulator system of claim 1 wherein a component under test is physically remote from the docking station and electrically connected to one or more sets of first terminals.

13. A method of emulating an AC electrical system having multiple interconnected components, the method comprising:
providing a first plurality of first emulator circuit boards, each first emulator board having a first processor and a first controllable AC voltage source having a first set of AC output terminals and a second plurality of second emulator boards, each of the second emulator boards having a second processor and a second coat, source and a second set of AC output terminals;
electrically interconnecting the first set of AC output terminals of the first plurality of first emulator circuit boards so as to simulate a first bus of the modeled electrical power grid;
electrically interconnecting the second set of AC output terminals of the second plurality of second emulator circuit boards so as to simulate a second bus of the modeled electrical power grid;
electrically connecting the first set of AC output terminals to the second set of AC output terminals;
using each first processor to generate AC voltage at each corresponding first set of AC output terminals so as to emulate a set of first components of the AC electrical system; and
using each second processor to generate AC voltage at each corresponding second set of AC output terminals so as to emulate a set of second components of the AC electrical system.

14. The method of claim 13 and further comprising:
providing a third set of third emulator boards, each third emulator board having a third processor and a third set of AC output terminals;
electrically interconnecting the third set of AC output terminals of the third plurality of third emulator circuit boards so as to simulate a third bus of the modeled electrical power grid;
electrically connecting the third set of AC output terminals to the second set of AC output terminals; and
using each third processor to generate AC voltage at each corresponding third set of AC output terminals so as to emulate a set of third components of the AC electrical system.

15. The method of claim 13 and further comprising:
providing a first docking station having a set of first docking terminals for emulated line power, the first docking station comprising a first set of guides to removably receive the first emulator circuit boards and align each of the first set of AC output terminals to set of first docking terminals and a second docking station having a set of second docking terminals for emulated line power, a second set of guides to removably receive the second emulator circuit boards and align the second set of AC output terminals to the set of second docking terminals;
inserting the first emulator circuit boards into the first docking station using the first set of guides to electrically connect each of the first set of AC output terminals to the first set of docking terminals; and
inserting the second emulator circuit boards into the second docking station using the second set of guides to electrically connect each of the second set of AC output terminals to the second set of docking terminals.

16. The method of claim 15 and further comprising:
providing a third set of third emulator boards, each third emulator board having a third processor and a third set of AC output terminals;
electrically interconnecting the third set of AC output terminals of the third plurality of third emulator circuit boards so as to simulate a third bus of the modeled electrical power grid;
using each third processor to generate AC voltage at each corresponding third set of AC output terminals so as to emulate a set of third components of the electrical system; and
electrically connecting the third set of AC output terminals to the second set of AC output terminals.

17. The method of claim 13 wherein one of the first components of the AC electrical system is a generator and wherein the one of the second components of the AC electrical system is an electrical system load.

18. The electrical emulator system of claim 17 wherein the electrical system load is a motor.

* * * * *